US008891056B2

(12) United States Patent
    Shibazaki

(10) Patent No.: US 8,891,056 B2
(45) Date of Patent: Nov. 18, 2014

(54) STAGE APPARATUS AND EXPOSURE APPARATUS

(75) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 772 days.

(21) Appl. No.: 12/659,626

(22) Filed: Mar. 15, 2010

(65) Prior Publication Data

US 2010/0171941 A1 Jul. 8, 2010

Related U.S. Application Data

(63) Continuation of application No. 11/826,144, filed on Jul. 12, 2007, now abandoned.

(30) Foreign Application Priority Data

Jul. 14, 2006 (JP) .................................. 2006-194890

(51) Int. Cl.
    *G03B 27/42* (2006.01)
(52) U.S. Cl.
    USPC .................... 355/53; 355/67; 355/72; 355/75
(58) Field of Classification Search
    CPC ............ G03F 7/70716; G03F 7/70758; G03F 7/70816; G03F 7/707; G03F 7/70783; G03F 7/70858; G03F 7/7095; G03F 7/70825; G03F 7/70875; G03F 7/70708
    USPC .......................................... 355/53, 67, 72, 75
    See application file for complete search history.

(56) References Cited

U.S. PATENT DOCUMENTS

| 4,221,748 | A  | 9/1980  | Pasco et al.    |
|-----------|----|---------|-----------------|
| 5,528,118 | A  | 6/1996  | Lee             |
| 5,534,970 | A  | 7/1996  | Nakashima et al.|
| 5,969,441 | A  | 10/1999 | Loopstra et al. |
| 6,020,710 | A  | 2/2000  | Lee             |
| 6,266,133 | B1 | 7/2001  | Miyajima et al. |
| 6,341,007 | B1 | 1/2002  | Nishi et al.    |
| 6,400,441 | B1 | 6/2002  | Nishi et al.    |

(Continued)

FOREIGN PATENT DOCUMENTS

| JP | A 6-349701 | 12/1994 |
|----|------------|---------|
| JP | A 8-313842 | 11/1996 |

(Continued)

OTHER PUBLICATIONS

Office Action issued in Korean Patent Application No. 10-2009-7002896 on Nov. 12, 2010 (with Translation).

(Continued)

*Primary Examiner* — Steven H Whitesell Gordon
*Assistant Examiner* — Mesfin T Asfaw
(74) *Attorney, Agent, or Firm* — Oliff PLC

(57) ABSTRACT

A wafer stage system moves a wafer stage that retains a wafer via a wafer holder along a wafer base. For example, the wafer holder is formed from a material whose density is not uniform, such that the portion that includes the reflecting surface that reflects a measuring beam for position measurement is a high-density portion, and the other portions are low-density portions. Or, the wafer stage is formed from a material whose density is not uniform, such that the portion that includes the surface that constitutes a gas bearing is a high-density portion, and the other portions are low-density portions.

17 Claims, 7 Drawing Sheets

(56) References Cited

U.S. PATENT DOCUMENTS

| | | |
|---|---|---|
| 6,549,269 B1 | 4/2003 | Nishi et al. |
| 6,590,634 B1 | 7/2003 | Nishi et al. |
| 6,778,257 B2 | 8/2004 | Bleeker et al. |
| 6,897,963 B1 | 5/2005 | Taniguchi et al. |
| 7,009,359 B2 | 3/2006 | Del Puerto |
| 2002/0171817 A1 | 11/2002 | Babonneau et al. |
| 2005/0029981 A1 | 2/2005 | Del Puerto |
| 2005/0146701 A1* | 7/2005 | Holderer et al. ............ 355/67 |
| 2005/0248856 A1 | 11/2005 | Omura et al. |
| 2006/0011611 A1 | 1/2006 | Goto et al. |

FOREIGN PATENT DOCUMENTS

| | | |
|---|---|---|
| JP | A 8-330224 | 12/1996 |
| JP | A 10-163099 | 6/1998 |
| JP | A 10-214783 | 8/1998 |
| JP | A 11-135400 | 5/1999 |
| JP | A 11-317440 | 11/1999 |
| JP | A 2000-505958 | 5/2000 |
| JP | A 2000-164504 | 6/2000 |
| JP | A 2003-149363 | 5/2003 |
| JP | A 2004-304135 | 10/2004 |
| JP | A 2005-64507 | 3/2005 |
| JP | A 2006-170811 | 6/2006 |
| WO | WO 99/23692 A1 | 5/1999 |
| WO | WO 99/49504 A1 | 9/1999 |
| WO | WO 02/080185 A1 | 10/2002 |
| WO | WO 2004/019128 A2 | 3/2004 |
| WO | WO 2005/036618 A1 | 4/2005 |
| WO | WO 2005/059617 A2 | 6/2005 |
| WO | WO 2005/059618 A2 | 6/2005 |

OTHER PUBLICATIONS

International Search Report issued in PCT/JP2007/063721 on Aug. 21, 2007 (with Translation).
Written Opinion issued in PCT/JP2007/063721 on Aug. 21, 2007 (with Translation).
Computer translation of counterpart International Application No. WO 2005/036618.
English translation of counterpart International Application No. WO 99/23692.
Office Action issued in counterpart U.S. Appl. No. 11/826,144 on Sep. 15, 2009.
Oct. 6, 2011 Office Action issued in Korean Patent Application No. 10-2009-7002896 (with English translation).
Office issued in Korean Patent Application No. 10-2009-7002896 on Nov. 12, 2010 (with Translation).
Office Action issued in counterpart U.S. Appl. No. 11/826,199 on Sep. 15, 2009.
Jun. 5, 2013 Office Action issued in Taiwanese Patent Application No. 096125795 (with translation).
Dec. 6, 2011 Office Action issued in Japanese Patent Application No. 2008-524797 (with translation).

\* cited by examiner

STAGE APPARATUS AND EXPOSURE APPARATUS

CROSS-REFERENCE TO RELATED APPLICATION

This is a Continuation of application Ser. No. 11/826,144 filed Jul. 12, 2007, which claims priority of Japanese Patent Application No. 2006-194890, filed Jul. 14, 2006. The disclosure of the prior applications is hereby incorporated by reference herein in its entirety.

BACKGROUND

1. Field of the Invention

The present invention relates to a stage apparatus for driving an object, being suitably used for a stage system of an exposure apparatus that is used for transferring a mask pattern onto a substrate in a photolithography process for manufacturing devices such as semiconductor elements, imaging elements, liquid-crystal display elements, or thin-film magnetic heads and the like.

2. Related Art

In a photolithography process for manufacturing devices such as semiconductor elements or liquid-crystal display elements (electronic devices, micro-devices, and the like), in order to project and expose via a projection optical system a circuit pattern formed on a reticle (or photomask) onto a wafer (or glass plate etc.) on which a photosensitive material is applied, an exposure apparatus such as a stationary exposure type (one-shot exposure type) projection exposure apparatus (so-called stepper) based on the step-and-repeat method and a scanning exposure-type projection exposure apparatus (so-called scanning stepper) based on the step-and-scan method are used. These exposure apparatuses are provided with a reticle stage and a wafer stage for positioning and moving of the reticle and wafer, respectively.

In these stage systems, there are cases in which it is preferable that rigidity (bending rigidity) be as high as possible in order to obtain a high positioning accuracy. On the other hand, particularly in a reticle stage system of a scanning exposure type projection exposure apparatus, there are cases when weight saving in the moving portion is preferable or order to drive the moving portion at a high speed. Also, a weight saving in the stage system simplifies conveyance of the exposure apparatus, and is advantageous for lessening the burden on the plant where the exposure apparatus is to be installed.

When for example moving members in the stage system are made thin in order to lighten the stage system, difficulties related to manufacturing technology increase, which may lead to higher manufacturing costs. The bending rigidity and buckling strength of members made thin are inversely proportional to the cube of the thickness, and so fall by a large extent. In order to maintain the rigidity and strength at or above target values when reducing weight, provided the materials of the moving members of the stage system have the same specific rigidity (i.e., rigidity (coefficient of elasticity)/weight per unit volume), it is preferable to use materials having a low density. For example, art is disclosed of adopting a thinned structure or ribbed structure for moving members of a stage system in order to achieve further lightening after employing materials with as high a specific rigidity and low density as possible within a predetermined cost range (refer for example to PCT International Publication No. WO 2005/036618).

Recently large and heavy mirrors have been employed as a projection optical system of an exposure apparatus. In order to achieve a reduction in weight of such an exposure apparatus, weight saving in such a mirror is desired while maintaining a high degree of flatness of the reflecting surface.

A purpose of some aspects of the invention is to provide a stage apparatus and exposure apparatus that enables the achievement of a further weight reduction while scarcely lowering characteristics such as rigidity, strength, and degree of flatness.

SUMMARY

According to a first aspect of the present invention, a stage apparatus is provided that drives a moving portion on which an object is placed, the moving portion being provided with at least a predetermined member formed from a material having a non-uniform density distribution.

In the first aspect, a guide portion can be further provided, that guides the moving of the moving portion, the guide portion being provided with a predetermined member formed from a material having a non-uniform density distribution.

According to the first aspect of the present invention, it is possible to attain a further reduction in weight while scarcely lowering the necessary characteristics by raising the density of the material at the portions among the predetermined member where comparatively high rigidity, strength and degree of flatness are required, and lowering the density of the material at the other portions.

According to a second aspect of the present invention, an exposure apparatus is provided that illuminates a pattern by exposure light and exposes a substrate via the pattern with the exposure light, the exposure apparatus using the stage apparatus of the present invention in order to drive at least one of a mask on which the pattern is formed or the substrate.

According to a third aspect of the present invention, an exposure apparatus is provided that illuminates exposure light on a pattern via an illuminating optical system and exposes an image of the pattern on the substrate via a projection optical system, with either one of the illuminating optical system or the projection optical system having a mirror, and the density of the portion of the mirror where a reflecting surface is formed being higher than the density of the other portions.

According to the third aspect of the present invention, it is possible to reduce the weight of the mirror while maintaining the degree of flatness of the reflecting surface at a high level, and thus possible to reduce the weight of the exposure apparatus.

DESCRIPTION OF EMBODIMENTS

An example of a preferred embodiment of the present invention shall be described hereinbelow with reference to the drawings. The present embodiment is one in which the present invention is applied to a scanning exposure-type projection exposure apparatus (exposure apparatus) known as a scanning stepper.

Figure 1:
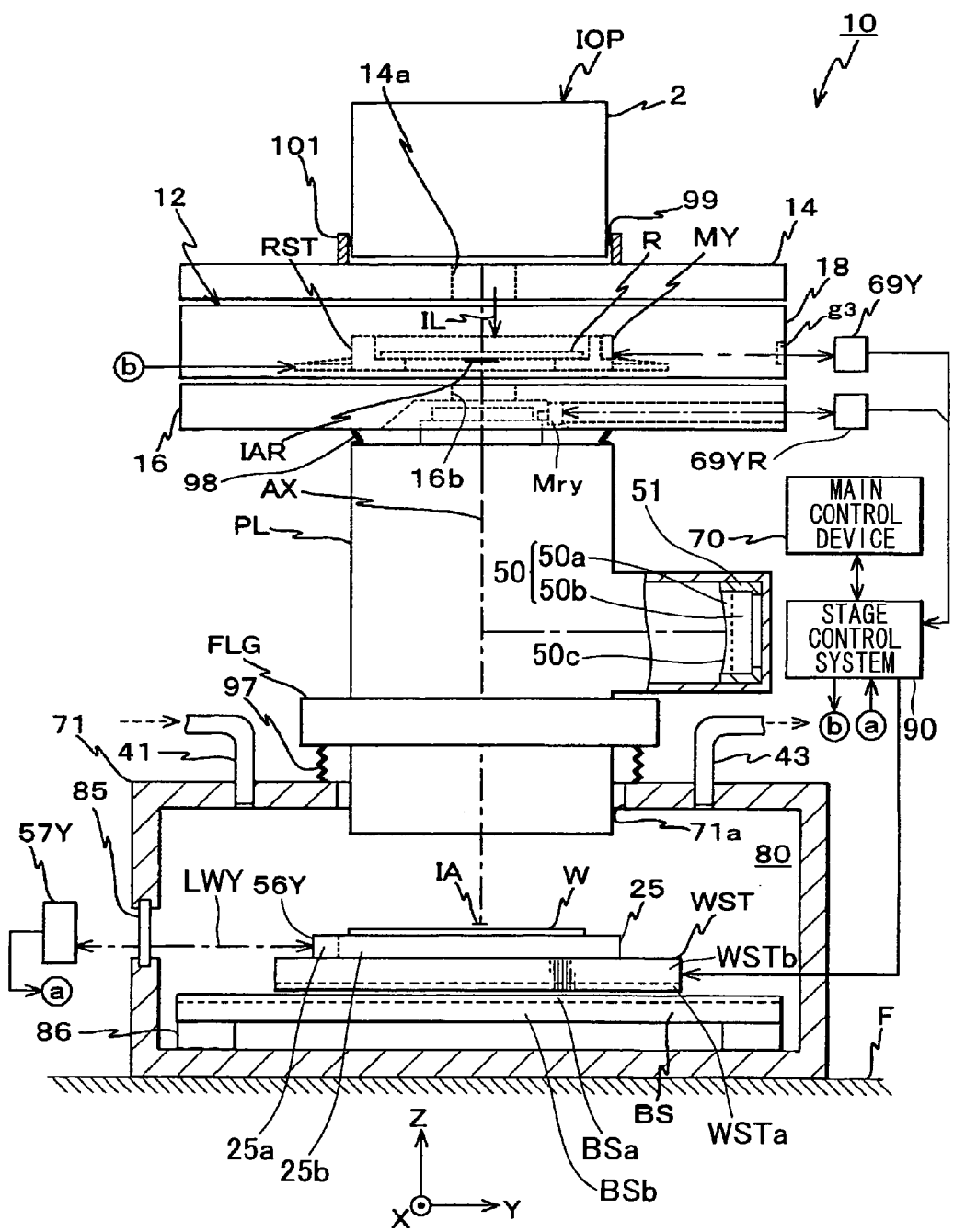
FIG. 1 is a partial cutaway view showing the schematic configuration of a projection exposure apparatus of an embodiment of the present invention.

FIG. 1 shows the schematic configuration of a projection exposure apparatus 10 of the present embodiment. In FIG. 1, the Z axis is taken that is perpendicular to the object surface (which is parallel to the image plane) of a projection optical system PL that is provided in the projection exposure apparatus 10; the Y axis is taken in the scanning direction of a reticle R and a wafer W during scanning exposure in the plane that is perpendicular to the Z axis; and the X axis is taken in the non-scanning direction perpendicular to the scanning direction (the direction perpendicular to the page in FIG. 1).

The projection exposure apparatus 10 of the present embodiment is provided with an illuminating optical system unit IOP, a reticle stage system 12 (stage apparatus) that drives the reticle R (mask) on which a circuit pattern is formed for a predetermined stroke in the Y direction and performs fine driving in the X direction, the Y direction and the θz direction (direction of rotation around the Z axis), a projection optical system PL, a wafer stage system (stage apparatus) for driving the wafer W (substrate) on which the resist is coated two-dimensionally in the X and Y directions in the XY plane, and their control systems and the like.

The illuminating optical system unit IOP includes an exposure light source and an illuminating optical system, and it illuminates the rectangular or circular-arc shaped illumination area IAR of the pattern face of the reticle R at a uniform luminance distribution with the exposure light IL. The illumination area IAR is prescribed by the field stop (reticle blind) disposed inside the illuminating optical system unit IOP. An illumination system similar to the illuminating optical system has been disclosed for example, in Japanese Unexamined Patent Application, First Publication No. H06-349701 (corresponding U.S. Pat. No. 5,534,970). Vacuum ultraviolet light such as ArF excimer laser light (wavelength 193 nm) or an $F_2$ laser light (wavelength 157 nm) may be used as the exposure light of the present embodiment. Deep ultraviolet light such as KrF excimer laser light (wavelength 248 nm), or bright lines of the ultraviolet region (g-rays, i-rays, and so on) from an extra-high pressure mercury lamp may also be used as the exposure light IL.

In the present embodiment, in the space on the optical path for the exposure light IL inside the illuminating optical system unit IOP and inside the projection optical system PL, as a gas with a high transmittivity with respect to the light of the vacuum-ultraviolet region, a purge gas consisting of nitrogen or an inert gas (such as helium) is filled. In addition, a purge gas is also supplied to a space in which the reticle R is arranged and the space in which the wafer W is arranged as described below.

Next, the reticle stage system 12 is disposed below the illumination system side plate (cap plate) 14 that has an annular fitting 101 connected to the outer circumference of the bottom end portion of the illuminating optical system unit IOP via a seal member 99. A rectangular opening 14a, which becomes the optical path (passage) for the exposure light IL, is formed at almost the center of the plate 14.

Figure 2:
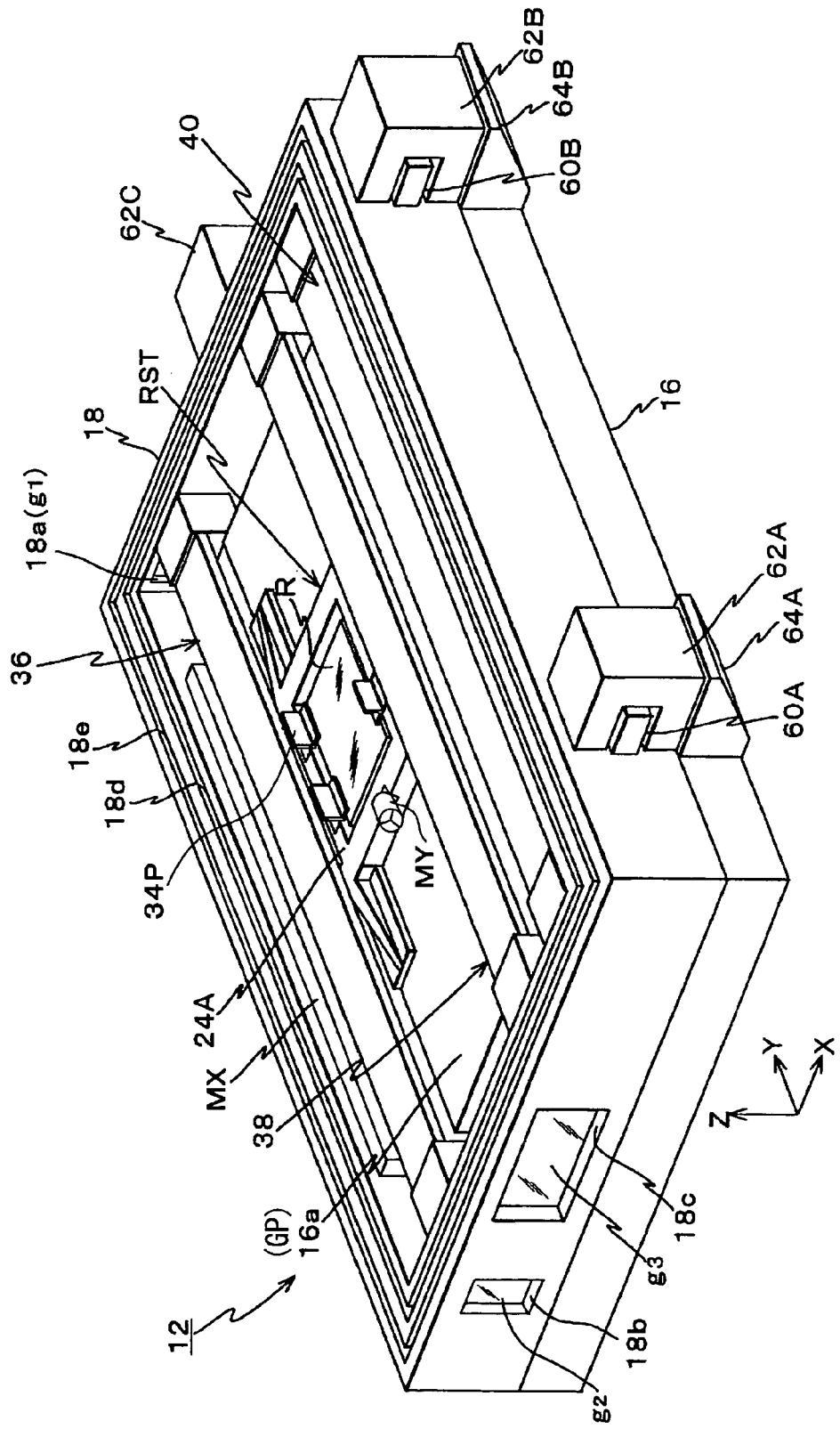
FIG. 2 is a perspective view showing the constitution of the frame member and the reticle stage of FIG. 1.

FIG. 2 is a perspective view of the reticle stage system 12 of FIG. 1. In FIG. 1 and FIG. 2, the reticle stage system 12 is provided with a reticle base 16 (guide portion) as a surface plate; a reticle stage RST (moving portion) disposed between this reticle base 16 and the illumination system side plate 14; a frame member 18 disposed between the reticle base 16 and the illumination system side plate 14 in the state of surrounding the reticle stage RST, and a reticle stage drive system that drives the reticle stage RST, and the like. The reticle base 16 is supported substantially horizontally by a supporting member (not shown in the figures).

Figure 3:
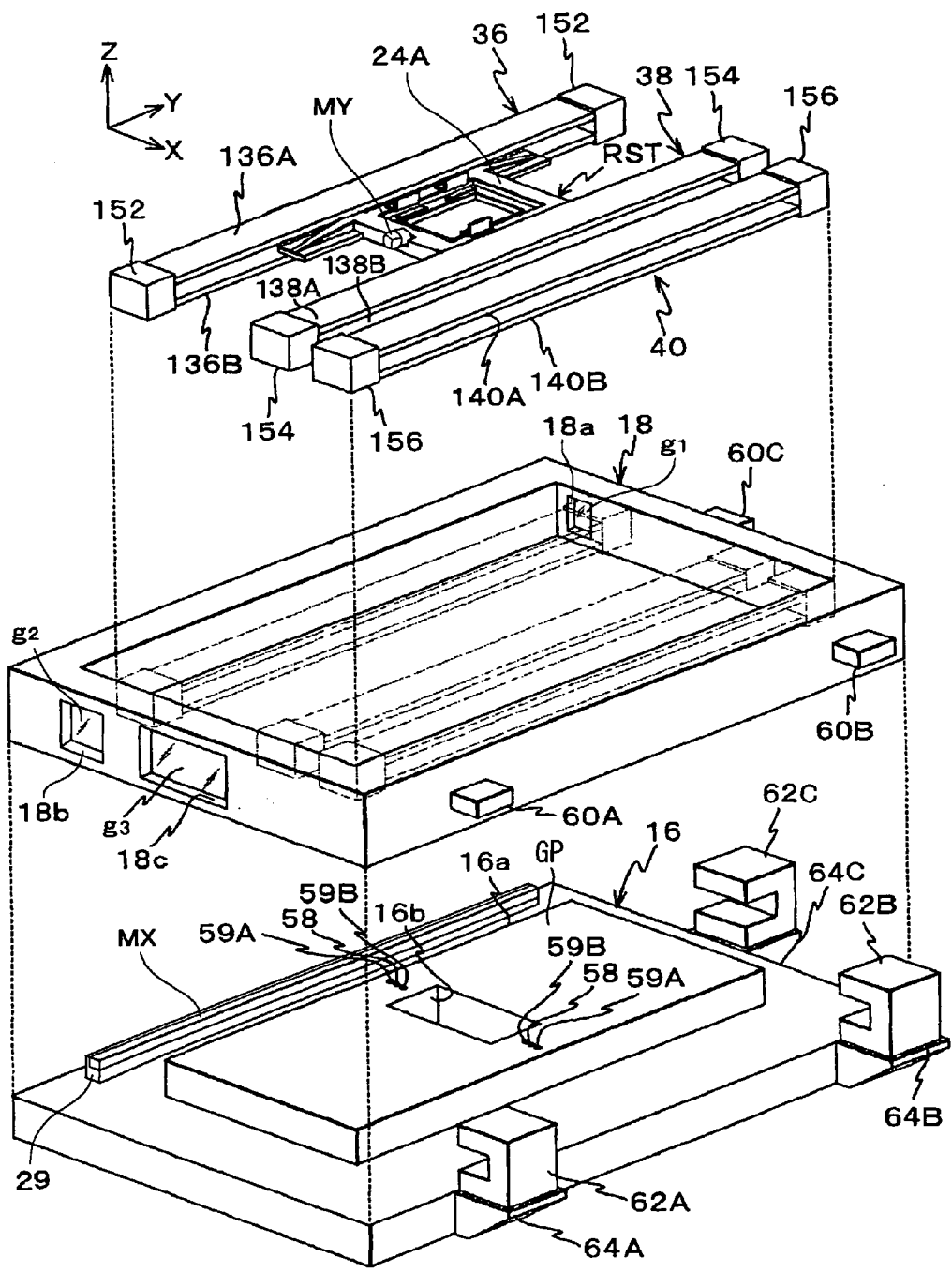
FIG. 3 is an exploded perspective view showing the constitution of the reticle stage, the frame member, and the reticle base of FIG. 1.

FIG. 3 is an exploded perspective view of FIG. 2. As shown in FIG. 3, a recessed guide portion 16a is formed at the center of this reticle base 16 which is of substantially plate form. The upper surface (guide face) GP of this guide portion 16a is finished to an extremely high level of flatness. An opening 16b is formed at substantially the center of the guide portion 16a for passing through the exposure light IL in the Z direction. The upper end of the lens barrel of the projection optical system PL is coupled via a seal member 98, in the state of surrounding the circumference of the opening 16b, to the side of the undersurface of the reticle base 16, as shown in FIG. 1.

Figure 4A:
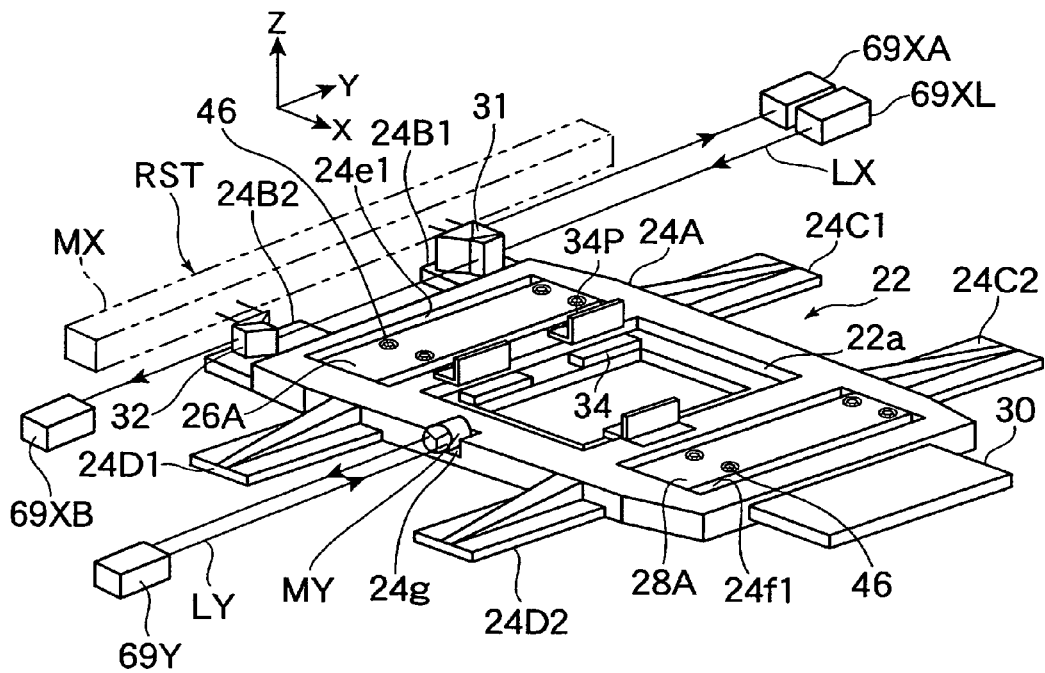
FIG. 4A is a perspective view showing the reticle stage of FIG. 1.

The reticle stage RST is provided with a reticle stage body 22 of a particular shape, as shown in FIG. 4A, and various kinds of magnet units (described in detail hereafter) fixed to this reticle stage body 22. The reticle stage body 22 is provided with a plate member 24A of approximately rectangular shape when viewed from above, two optical member support portions 24B1 and 24B2 as particular portions provided at the end portion of the plate member 24A in the −X direction, and two pairs of extension parts 24C1, 24C2, 24D1, 24D2 protruding in the Y direction from the ends of each side in the Y direction of the plate member 24A.

At approximately the center of the plate member 24A, a stepped opening 22a is formed at the center of the opening 22a1 (refer to FIG. 4B) that allows the exposure light IL to pass through. Multiple (for example, three) reticle supporting members 34 are installed to support the reticle R from multiple points (for example, three points) below the reticle R in the step portion of the stepped opening 22a. Corresponding to each reticle supporting member 34, multiple (for example, three) reticle fixing mechanisms 34P are installed in the plate member 24A for holding therebetween and fixing the reticle R.

Figure 4B:
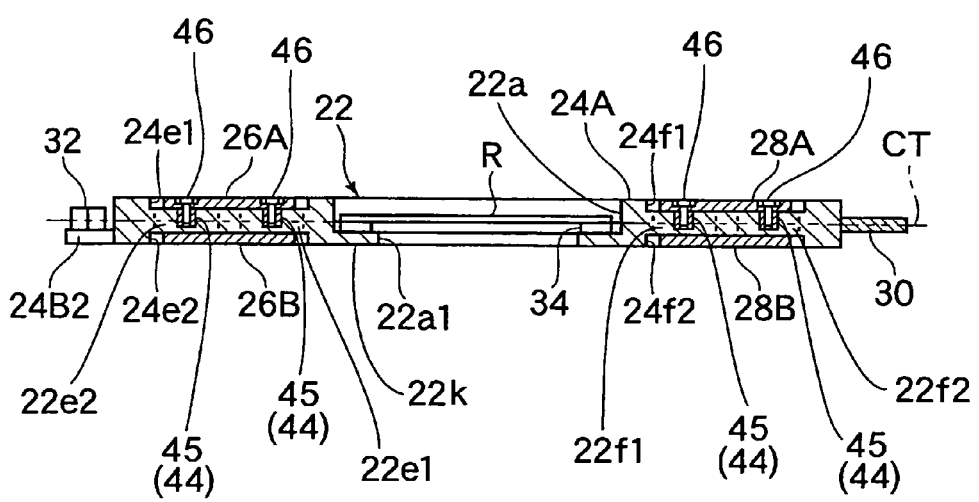
FIG. 4B is a cross-sectional view in the Y direction of the reticle stage.

FIG. 4B is a cross-sectional view along a plane that is parallel to the XZ plane of the reticle stage RST of FIG. 4A. As shown in FIG. 4A, with the pattern face (lower face) approximately coinciding with the neutral surface CT (surface that does not contract or expand when bending moment is received) of the reticle stage body 22 (reticle stage RST), the reticle R is supported by the multiple supporting members 34 (see FIG. 4B). Instead of, or together with the reticle supporting member 34 and the reticle fixing mechanism 34P, various kinds of attraction fixing mechanisms for a reticle such as a vacuum chuck or an electrostatic chuck may be used.

As shown in FIGS. 4A and 4B, a first optical system 31 and a second optical system 32 for position measurement of the reticle stage RST are respectively fixed to optical member support portions 24B1 and 24B2. The optical member support portion 24B1 can be locally coupled to the plate member 24A by a hinge portion (not illustrated) that acts as a type of flexure. Similarly, the optical member support portion 24B2 can be locally coupled to the plate member 24A by a hinge portion (not illustrated). Thereby, the effect of deformation of the plate member 24A is prevented from affecting the optical member support portions 24B1 and 24B2. In the present embodiment, the reticle stage body 22 including the plate member 24A, the optical member support portions 24B1 and 24B2, and the hinge portion (not illustrated) is integrally formed (for example, formed by machining a member) from a porous ceramic consisting of different density distribution portions (described in detail below). In this embodiment, each part is treated as a separate member where necessary to simplify the explanations. Naturally, any one of the parts mentioned above may be formed with another using different member.

Figure 6:
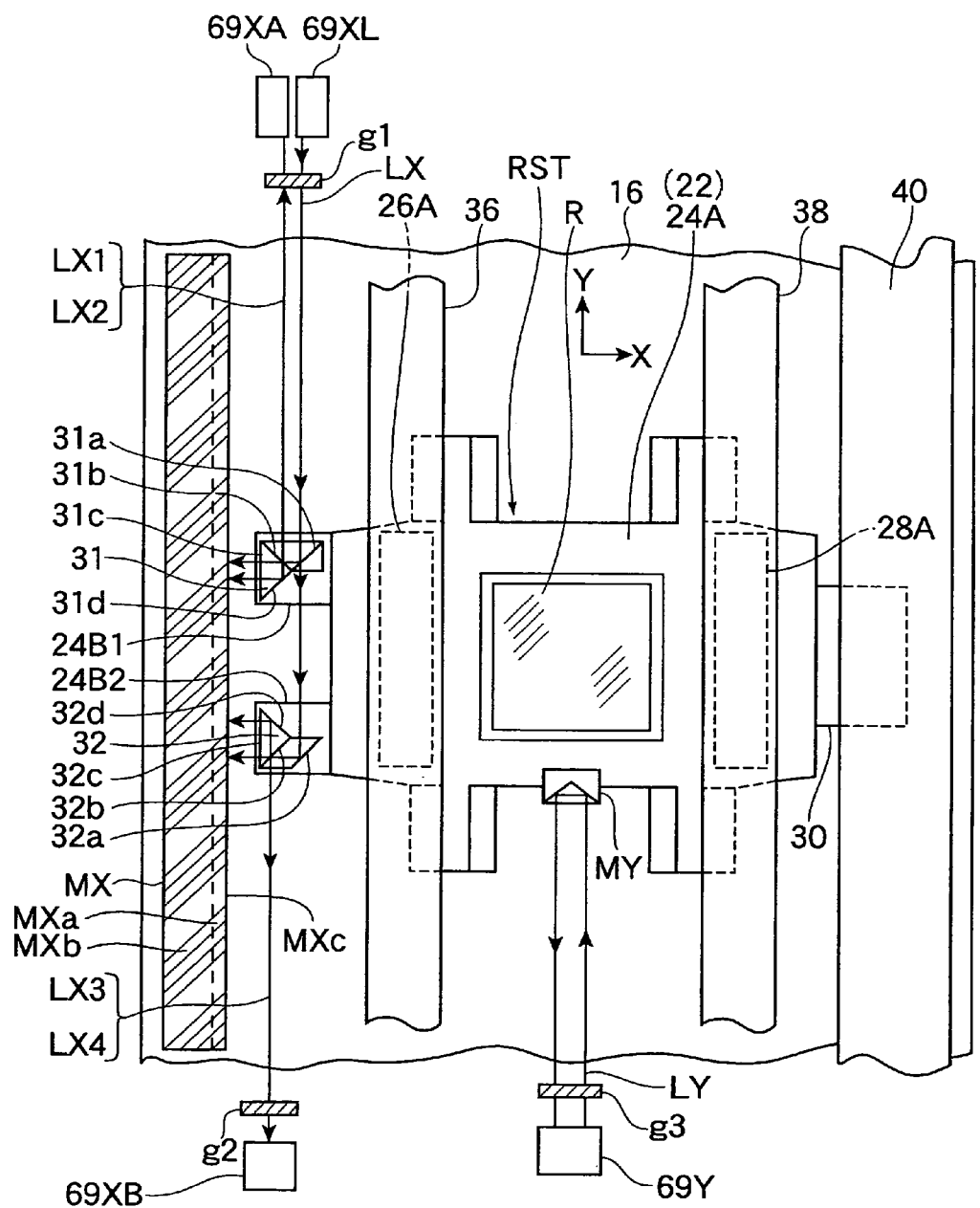
FIG. 6 is a plan view showing the main portions of the reticle stage of FIG. 1.

In the state of the reticle stage RST placed on the upper surface GP of the guide portion 16a of the reticle base 16 in FIG. 2, as shown by the chain double-dashed line in FIG. 4A, a rod-shaped X-axis fixed mirror MIX (reference mirror) is arranged parallel to the Y axis on the side face in the −X direction of the optical systems 31 and 32. As shown in FIG. 3, the fixed mirror MX is fixed via a narrow supporting member 29 along the Y axis in a region near the guide portion 16a on the reticle base 16. The fixed mirror MX can have a high density portion MXa and a low density portion MXb. The density of the low density portion MXb can be set to approximately ½, ⅓, ¼, ⅕, ⅙, 1/7, ⅛, 1/9, 1/10, or 1/20 or less than that of the high density portion MXa. In one embodiment, the fixed mirror MX, as shown in FIG. 6, is formed from a porous ceramic consisting of the high density portion MXa with a density of approximately 3 to 4 $g/cm^3$ and the low density portion MXb with a density of approximately 0.3 to 0.4 $g/cm^3$, which is 1/10 that of the high density portion MXa. The side face of the high density portion MXa of the fixed mirror MX that is substantially parallel to the ZY plane in the +X direction (the portion where a high degree of flatness is locally required compared to other portions) is finished to an extremely high degree of flatness, and serves as a reflecting surface MXc on which a film with a high reflectance such as chrome is deposited.

Note that in the present embodiment, the density of the low density portion MXb being around 1/10 means, for example, 1/20 to ⅕ of the density of the high density portion MXa, that is, if the density of the high density portion MXa is 3 to 4 $g/cm^3$, the density of the lower density portion MXb would be from 0.15 to 0.2 $g/cm^3$ to 0.6 to 0.8 $g/cm^3$ (0.15 to 0.8 $g/cm^3$ as a whole) (the same hereinbelow). By forming the reflecting surface MXc on the high density portion MXa in this way, it is possible to sufficiently lighten the fixed mirror MX and maintain the degree of flatness of the reflecting surface at a high level. Note that the density of the high density portion may be other than 3 to 4 $g/cm^3$, and the density of the low density portion may simply be lower than the high density portion. Even in this case, by maintaining the degree of flatness and rigidity, etc. of the necessary portion at a high level, as a whole the effect is obtained of lightening the relevant member (here, the fixed mirror MX).

The fixed mirror MX can be fabricated by adhering together the high density portion MXa with a low percentage of holes and the low density portion MXb with a high percentage of holes and subjecting to thermal setting. In the present embodiment, it is possible to similarly manufacture another member that is formed from a material whose density is not uniform. The density of the fixed mirror MX is the portion that includes the reflecting surface MXc and so is high, and may be low for other portions. For that reason, in the fixed mirror MX, the density from the portion of the reflecting surface MXc to the side face of the opposite side may be made to continuously become lower. As the material of the fixed mirror MX and the member formed from a material whose density distribution is not uniform as described below, it is possible to use a sintered metal in addition to a porous ceramic. As the sintered metal material, it is possible to use aluminum, magnesium, iron, copper, tungsten, stainless steel, and the like, and alloys thereof.

In the state of the reticle stage RST placed on the upper surface GP of the guide portion 16a of the reticle base 16 in FIG. 2, as shown in FIG. 4A, a laser light source 69XL and a first receiver 69XA on the X axis that is a photoelectric sensor are placed facing the +Y direction for the first optical system 31 on the reticle stage RST, and a second receiver 69XB on the X axis that consists of a photoelectric sensor is placed so as to face the −Y direction for the second optical system 32 on the reticle stage RST. A laser beam LX for measurement that includes two laser beams that are substantially parallel to the Y axis from the laser light source 69XL, have a predetermined frequency difference at a wavelength of, for example, 633 nm (He—Ne laser), and whose polarization directions are mutually perpendicular are directed to the first optical system 31. The first optical system 31 divides the irradiated laser beam LX into a first laser beam and a second laser beam, and furthermore divides the first laser beam into the two X axis beams of a first measuring beam and a first reference beam in accordance with the polarization state. Also, the first optical system 31 directs the first measuring beam to the reflecting surface of the fixed mirror MX by a double-pass method parallel to the X axis, and directs the interference light of the reflected first measuring beam and the first reference beam to the first receiver 69XA substantially parallel to the Y axis.

Moreover, the first optical system 31 directs the second laser beam after the above-described division to the second optical system 32. The second optical system 32 divides the incident second laser beam into the two X axis beams of a second measuring beam and a second reference beam in accordance with the polarization state. Then, the second optical system 32 directs the second measuring beam to the reflecting surface of the fixed mirror MX by the double-pass method parallel to the X axis, and directs the interference light of the reflected second measuring beam and the second reference beam to the second receiver 69XB substantially parallel to the Y axis. The position in the Z direction of the first and second measuring beams substantially matches the neutral surface CT (reticle surface). Note that specific constitution examples for generating interference light by the optical system 31 and the optical system 32 will be described later. The receiver 69XA and the receiver 69XB always measure at a resolution of for example approximately 0.1 nm the coordinates (displacement) in the X direction of the optical systems 31 and 32 (that is, two positions separated in the Y direction of the reticle stage RST), taking the fixed mirror MX (that is, the reticle base 16) as the reference by performing a photoelectric conversion of the incident interference light. From that measured value, the position XR in the X direction and the angle of rotation θzR (yawing) around the Z axis of the reticle stage RST are found. This position data XR and θzR is supplied to the stage control system 90 of FIG. 1. In this way, the optical systems 31 and 32 are positioned on the reticle stage RST, and by arranging the rod-shaped fixed mirror MX on the outside, the reticle stage RST can be lightened, and so it is possible to stably drive the reticle stage RST at a faster speed.

Figure 5:
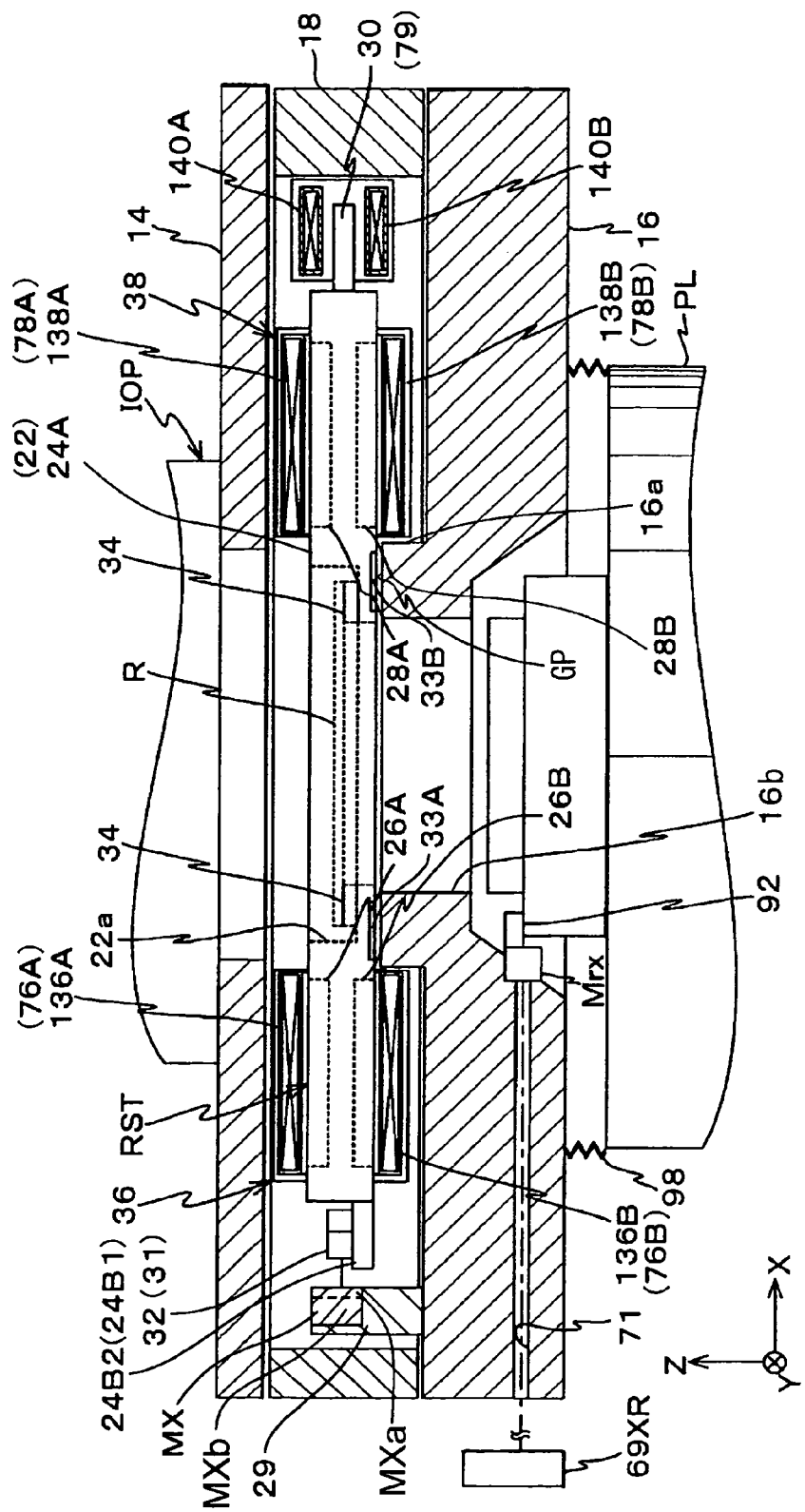
FIG. 5 is a cross-sectional view in the Y direction of the illumination system side plate, the reticle stage, and the reticle base of FIG. 1.

FIG. 5 is a cross-sectional drawing in the Y direction of the reticle stage system 12 of FIG. 1. As shown in FIG. 5, the fixed mirror Mrx is installed on the side surface in the −X direction near the upper end of the lens barrel of the projection optical system PL via the fitting member 92. An X-axis laser interferometer 69XR for the projection optical system PL is supported by a column not illustrated so as to face the fixed mirror Mrx. A measuring beam from the laser interferometer 69XR is projected onto the fixed mirror Mrx via a through hole (optical path) 71 that is formed on the reticle base 16, and its reflected light returns inside the laser interferometer 69XR. The laser interferometer 69XR receives the interference light between the reference beam generated internally and the reflected light with an internal photoelectric sensor. Then, based on the detection signal of the photoelectric sensor, the laser interferometer 69XR always measures at a resolution of approximately 0.1 nm, for example, the position in the X direction of the projection optical system PL, and supplies the measurement result to the stage control system 90 of FIG. 1. In the stage control system 90, by determining the difference between the position of the reticle stage RST in the X direction and the position of the projection optical system PL in the X direction, it is possible to determine the position of the reticle stage RST in the X direction with the projection optical system PL serving as the reference.

Note that when measuring the position of the optical systems 31 and 32 of FIG. 4A in the X direction with respect to the fixed mirror MX, it is possible to use the laser beam that is reflected by the fixed mirror Mrx on the side surface of the projection optical system PL of FIG. 5 as the reference beam, and detect the interference light between the reference beam and the measuring beam that is reflected by the fixed mirror MX with the receivers 69xA and 69XB. Thereby, it is possible to directly measure the position of the reticle stage RST in the X direction with the projection optical system PL taken as the reference.

Also, in FIG. 4A, a recessed portion 24g is formed at the end of the plate member 24A of the reticle stage body 22 in the −Y direction. A retro-reflector MY consisting of a corner mirror is provided in the recessed portion 24g as a Y-axis moving mirror. In the state of the reticle stage RST placed on the upper surface GP of the guide portion 16a of the reticle base 16 in FIG. 2, as shown in FIG. 4A, the Y-axis laser interferometer 69Y is disposed so as to face the −Y direction with respect to the retro-reflector MY. The measuring beam LY from the laser interferometer 69Y is projected onto the reflecting surface of the retro-reflector MY parallel with the Y axis, and that reflecting light returns to the laser interferometer 69Y. In this case also, the position of the illumination point of the measuring beam LY in the Z direction substantially coincides with the position of the neutral surface CE (reticle surface). The laser interferometer 69Y, by performing photoelectric detection of the interference light between the measuring beam LY and the reference beam that is generated therein, always measures at a resolution of approximately 0.1 nm, for example, taking the internal reference surface as a reference, the position YR in the Y direction of the reticle stage RST (reticle stage body 22), and supplies the measurement result to the stage control system 90 of FIG. 1.

Also, as shown in FIG. 1, the fixed mirror Mry is installed on the side surface in the +Y direction near the upper end of the lens barrel of the projection optical system PL via the fitting member. A Y-axis laser interferometer 69YR for the projection optical system PL is disposed so as to face the fixed mirror Mry. A measuring beam from the laser interferometer 69YR is projected onto the fixed mirror Mry via a through hole (optical path) that is formed on the reticle base 16, and its reflected light returns within the laser interferometer 69YR. The laser interferometer 69YR receives the interference light between the reference beam generated internally and the reflected light with an internal photoelectric sensor. Then, based on the detection signal of the photoelectric sensor, the laser interferometer 69YR always measures at a resolution of approximately 0.1 nm, for example, the position in the Y direction of the projection optical system PL, and supplies the measurement result to the stage control system 90 of FIG. 1. In the stage control system 90, by determining the difference between the position of the reticle stage RST in the Y direction and the position of the projection optical system PL in the Y direction, it is possible to determine the position of the reticle stage RST in the Y direction with the projection optical system PL serving as the reference.

Note that when measuring the position of the reticle stage RST of FIG. 4A in the Y direction, it is possible to use the laser beam that is reflected by the fixed mirror Mry on the side surface of the projection optical system PL of FIG. 1 as the reference beam, and detect the interference light between the reference beam and the measuring beam that is reflected by the retro-reflector MY. Thereby, it is possible to directly measure the position of the reticle stage RST in the Y direction with the projection optical system PL taken as the reference.

In the present invention, the four extension parts 24C1, 24C2, 24D1, 24D2 of FIG. 4A are in substantially plate form, and a reinforcement (rib) with triangular cross section is provided in each extension part for enhancing its strength. At the bottom face of the reticle stage body 22, a first differential exhaust type static pressure gas bearing is formed in the Y direction extending all through from the extension part 24C1 to the extension part 24D1, and a second differential exhaust type static pressure gas bearing is formed in the Y direction extending all through from the extension part 24C2 to the extension part 24D2.

That is, differential exhaust type air pads 33A and 33B are disposed as shown in FIG. 5 on a region extending from the extension part 24C1 to the extension part 24D1 and a region extending from the extension part 24C2 to the extension part 24D2 at the bottom face of the reticle stage body 22. The reticle stage RST is held in a non-contact floating manner via a clearance of approximately several microns above the upper surface (guide surface) GP of the guide portion 16a by the balance between the static pressure of the pressurizing gas blown over the upper surface GP of the guide 16a of the reticle base 16 from the air pads 33A and 33B and the self-weight of the entire reticle stage RST.

Returning to FIG. 2, two overlapped substantially annular recessed portions 18d, 18e are formed on the upper surface of the frame member 18. Multiple intake openings (not shown in the figures) are formed in the inner groove (hereinafter referred to as the "supply groove") 18d, and multiple exhaust openings (not shown in the figures) are formed in the outer groove (hereinafter referred to as "exhaust groove") 18e. The intake opening formed within the supply groove 18d is connected to the gas supply apparatus (not shown in the figures) that supplies purge gas via the supply pipe passage and supply piping (not shown in the figures). The exhaust opening formed within the exhaust groove 18e is connected to the vacuum pump (not shown in the figures) via the exhaust pipe passage and the exhaust piping (not shown in the figures). Differential exhaust type static pressure gas bearings are formed substantially to include the supply groove 18d and the exhaust groove 18e on the upper surface of the frame member 18 to support in a floating manner the illumination system side plate 14 of FIG. 1 via a clearance of approximately several microns above the upper surface of the frame member 18.

Also, a supply groove and exhaust groove (not shown in the figures), which are substantially annular grooves corresponding to the supply groove 18d and the exhaust groove 18e on the upper surface, are formed on the bottom surface of the frame member 18. These supply and exhaust grooves are also connected to the gas supply apparatus for purge gas and the vacuum pump (not shown in the figures). Including the supply groove and the exhaust groove, differential exhaust-type static pressure gas bearings are configured substantially to support in a floating manner the frame member 18 via a clearance of approximately several microns above the upper surface of the reticle base 16. In this case, since a gas flow arises from the supply groove 18d and the like to the exhaust groove 18e and the like, mixing of outside air in the frame member 18 is effectively deterred by those clearances.

In this way, the clearance between the frame member 18 and the illumination system side plate 14 of FIG. 1 and the clearance between the reticle base 16 and the frame member 18 is made air tight by the flow of the purge gas, and moreover the space between the top end portion of the projection optical system PL and the reticle base 16 is covered by the sealing member 98. Accordingly, within the space surrounded by the frame member 18 is a space with extremely high air tightness. Hereinbelow, the space that is surrounded by the frame member 18 is referred to as an airtight space for the sake of convenience.

The abovementioned purge gas that allows the exposure light the pass through is supplied by the gas supply apparatus and the vacuum pump (not shown in the figures) to the airtight space as well that includes the reticle R that is surrounded by the frame member 18 of the present embodiment in order to maintain the transmittivity at a high level with respect to the exposure light. A rectangular opening 18a is formed as shown in FIG. 3 on the end portion of the side wall of the +Y direction of the frame member 18, and a window glass g1 is fitted in this rectangular opening 18a. Moreover, rectangular openings 18b and 18c are respectively formed in the end portion and the center portion of the side wall in the −Y direction of the frame member 18, and window glasses g2 and g3 are fitted in these rectangular openings 18b and 18c, respectively. In the arrangement of the laser interferometer of FIG. 4A, the laser light source 69XL and the receiver 69XA are in practice arranged on the outside of the rectangular opening 18a of FIG. 3, and the receiver 69XB and the laser interferometer 69Y are respectively arranged on the outside of the rectangular openings 18b and 18c of FIG. 3. In this case, since the window glasses g1, g2, and g3 are provided, it is possible to measure the position of the reticle stage RST by a laser interferometer without damaging the airtightness of the airtight space in the frame member 18.

Next, as shown in FIG. 2, the reticle stage drive system is provided with a pair of first drive mechanisms 36, 38 that drive the reticle stage RST in the Y direction and also finely drive it in the θz direction (direction of rotation around the Z axis), and a second drive mechanism 40 that finely drives the reticle stage RST in the X direction. The stage control system 90 controls the driving of the first and second drive mechanisms based on the position XR in the X direction, the position YR in the Y direction and the angle of rotation θzR around the Z axis of the reticle stage RST that are measured by the laser interferometer, and data from a main control device 70. The first drive mechanisms 36, 38 are erected within the frame member 18 to be mutually parallel along the Y direction. The second drive mechanism 40 is erected along the Y direction, on the +X direction side of the first drive mechanism 38 that is erected inside of the frame member 18.

As shown in the exploded perspective view in FIG. 3, the first drive mechanism 36 is provided with stator units 136A, 136B each disposed with a pair of coil units the length direction of which is the Y direction, and a pair of fixing members 152 that retain either end of the stator units 136A, 136B in the Y direction (oriented lengthwise). In this case, the stator units 136A, 136B are disposed at a specific spacing in the Z direction (vertical direction) to face each other and are held parallel to each other in the XY plane by a pair of fixing members 152. Each of the pair of fixing members 152 is fixed to the inner wall face of the frame member 18.

As can be observed from FIG. 5 which is the cross section view near the reticle stage body 22 of FIG. 3 and FIG. 1, the stator units 136A, 136B include a frame of rectangular cross section (longitudinal direction) made of a non-magnetic material, wherein multiple coils are disposed at specific spacing in the Y direction. The first drive mechanism 38 on the +X direction side is also configured similar to the first drive mechanism 36. That is, the first drive mechanism 38 is provided with stator units 138A, 138B each disposed with a pair of coil units oriented lengthwise in the Y direction, and with a pair of fixing members 154 for fixing the two ends of the stator units 138A, 138B maintained at a specific spacing in the Z direction. Each of the pair of fixing members 154 is fixed to the inner wall face of the frame member 18. The stator units 138A, 138B are configured in a similar manner as the stator units 136A, 136B (refer to FIG. 5).

The reticle stage RST is provided between the upper stator units 136A, 138A and the lower stator units 136B, 138B via a specific clearance, as shown in FIG. 5. In this case, moving units 26A, 26B are fixed in a pair of magnet units (magnetic pole units) each disposed on the upper surface and lower surface of the reticle stage RST and each facing the stator units 136A, 136B. The moving units 28A, 28B are fixed in a pair of magnet units each disposed on the upper surface and lower surface of the reticle stage RST, and each facing the stator units 138A, 138B. In the present embodiment, the moving units 26A, 26B and 28A, 28B are used as magnet units disposed in the Y direction with multiple permanent magnets that generate a magnetic field in the Z direction at a predetermined pitch while reversing polarity, but electromagnets and the like may be used instead of the permanent magnets.

As shown in FIG. 4B, each of the moving units 26A, 26B is disposed in the recessed portions 24e1, 24e2 formed in the reticle stage body 22. The recessed portions 24e1, 24e2 are respectively formed on the upper and lower faces symmetrically about the neutral surface CT of the reticle stage body 22, in the −X direction side of the stepped opening 22a of the plate member 24A of the reticle stage body 22. In this case, the stator units 136A, 136B of FIG. 5 are positioned almost symmetrically about the neutral surface CT taken as the reference. An alternating magnetic field is formed in the Y direction in the space above the moving unit 26A and in the space below the moving unit 26B.

In the present embodiment, both end portions of the recessed portions 24e1, 24e2 formed in the reticle stage body 22 that is made of a porous ceramic of FIG. 4B serve as high density portions 22e1, 22e2. A recessed portion 44 is formed in the high density portions 22e1, 22e2. A metal screw bush 45 is embedded in the recessed portion 44 and fixed by adhesion, for example. A bolt 46 is passed through the moving unit 26A, and by fastening to the screw hole of the screw bush 45, the moving unit 26A is fixed to the recessed portion 24e1. As shown in FIG. 4A, the moving unit 26A is fixed to the recessed portion 24e1 by the bolt 46 at four places. Accordingly, the high density portion is additionally provided at two places (refer to FIG. 7). Also, a screw bush (not illustrated) is embedded in the bottom face of the high density portions 22e1, 22e2, and the moving unit 26B is fixed to the recessed portion 24e2 by bolts at four places. Also, note that a helisert may be used instead of a screw bush.

Similarly, as shown in FIG. 4B, each of the moving units 28A, 28B, is disposed in the recessed portions 24f1, 24f2 formed in the reticle stage body 22. The recessed portions 24f1, 24f2 are formed on the upper and lower faces symmetrically about the neutral surface CT of the reticle stage body 22, on the +X direction side of the stepped opening 22a of the plate member 24A of the reticle stage body 22. Also, the first stator units 138A, 138B of FIG. 5 are positioned almost symmetrically about the neutral surface CT taken as the reference. The constitution of the pair of moving units 28A, 28B is similar to the moving units 26A, 26B. An alternating magnetic field is formed in the Y direction in the space above the moving unit 28A and also in the space below the moving unit 28B.

Both end portions of the recessed portions 24f1, 24f2 of the reticle stage body 22 of FIG. 4B serve as high density portions 22f1, 22f2 (in practice, there are an additional two high density portions). A recessed portion 44 is formed in the high density portions 22f1, 22f2. A metal screw bush 45 is embedded in these recessed portions 44 and fixed, and a screw bush (not illustrated) is embedded in the bottom face side. The bolts 46 are passed at four places through the moving units 28A and 28B, and by fastening to the screw hole of the screw bush 45, the moving units 28A and 28B are fixed to the recessed portions 24f1 and 24f2.

Figure 7:
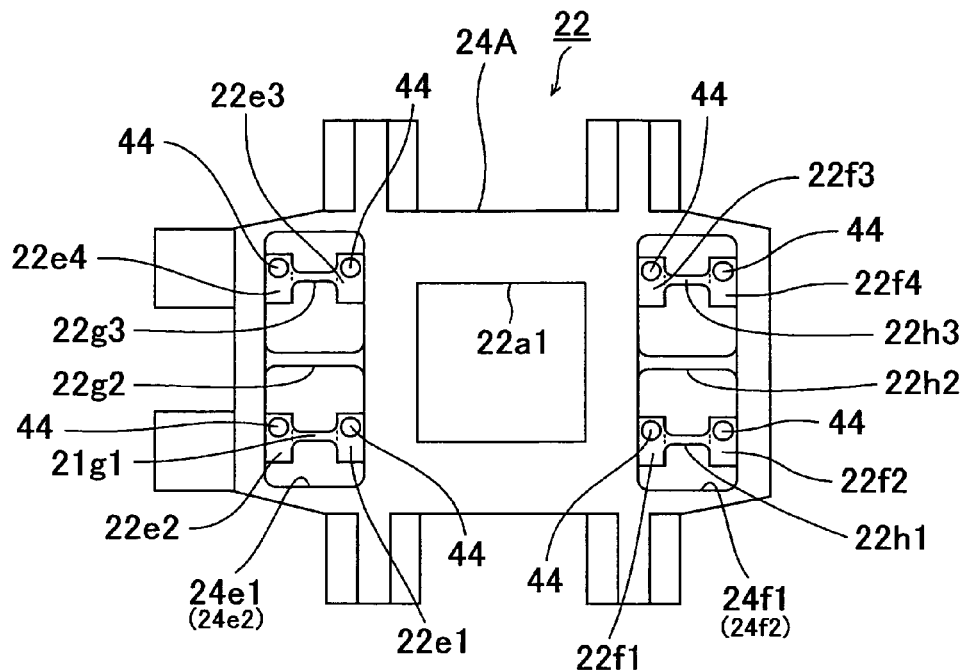
FIG. 7 is a plan view showing the reticle stage body of FIG. 4A.

FIG. 7 shows the reticle stage body 22. In FIG. 7, the recessed portions 24e1, 24e2 of one side of the reticle stage body 22 become a punch-out portion. Three ribs 22g1, 22g2, 22g3 are erected in the center of the punch-out portion. High density portions 22e1, 22e2, 22e3, 22e4 that have recessed portions 44 are erected on both end portions of the ribs 22g1, 22g3 on both sides. Symmetrical to this, the recessed portions 24f1, 24f2 of the other side of the reticle stage body 22 become a punch-out portion. Three ribs 22h1, 22h2, 22h3 are erected in the center of the punch-out portion. High density portions 22f1, 22f2, 22f3, 22f4 that have recessed portions 44 are erected on both end portions of the ribs 22h1, 22h3 on both sides. The density of the other portion (low density portion) of the reticle stage body 22 can be set to approximately ½, ⅓, ¼, ⅕, ⅙, ⅐, ⅛, ⅑, ⅒, or 1/20 or less of the high density portions 22f1, 22f2 and 22f3, 22f4. In one embodiment, the density of the high density portions 22e1 to 22e4 and 22f1 to 22f4 is approximately 3 to 4 g/cm$^3$, and the density of the other portion (low density portion) of the reticle stage body 22 is approximately 1/10 that of the high density portion. Thereby, it is possible to obtain sufficient strength at the high density portions 22e1 to 22e4 and 22f1 to 22f4 that have recessed portions 44 in which the screw bush 45 is embedded (portions in which a higher strength is locally required than other portions). Also, since the ribs 22g1 to 22g3 and 22f1 to 22f3 are low density members, even if their wall thickness is increased in order to increase the bending rigidity and buckling strength, there is hardly any increase in weight. Accordingly, it is possible to reduce the overall weight of the reticle stage body 22.

Note that as shown in FIG. 5, the bottom surface of the central portion of the reticle stage body 22 is oppositely disposed sandwiching a compressed gas layer so as to constitute a gas bearing with the guide portion 16a of the reticle base 16. Accordingly, a portion that includes the bottom surface of the central portion of the reticle stage body 22 may serve as a high density portion so that a high degree of flatness is obtained. Similarly, the reticle base 16 may be formed from a material with a non-uniform density distribution, such that the portion that includes the guide portion 16a of the reticle base 16 may be a high density portion, and the other portions may be a low density portion.

In this embodiment, the stator units 136A and 138A and the moving units 26A and 28A disposed to face each other on the side of the reticle stage body 22 form the first Y-axis linear motor 76A and the second Y-axis linear motor 78A, respectively, as shown in FIG. 5. Also, the lower stator units 136B and 138B and the moving units 26B and 28B corresponding to the side of the reticle stage body 22 form the third Y-axis linear motor 76B and the fourth Y-axis linear motor 78B. That is, the first drive mechanisms 36, 38 are constituted from the first, second, third and fourth Y-axis linear motors 76A, 78A, 76B, 78B.

In this way, the Y-axis linear motors 76A, 78A, 76B, 78B generate thrust that drives the moving units 26A, 28A, 26B, 28B (moving pieces) in the Y direction relative to the stator units 136A, 138A, 136B, 138B (stator units). In practice, the stator moves slightly in the opposite direction as the mover due to the reaction to this thrust. For this reason, the member with relatively frequent movement is called the mover or moving unit, and the member with relatively less frequent movement is called stator or stator unit in this specification.

In this case, the stator units 136A, 138A, 136B, 138B of the first, second, third and fourth Y-axis linear motors 76A, 78A, 76B, 78B are connected to the frame member 18 shown in FIG. 2. The moving units 26A, 28A, 26B, 28B are each fixed to the reticle stage RST (reticle stage body 22) as moving stages shown in FIG. 2. Also, the first and second Y-axis linear motors 76A and 78A are disposed separately and almost symmetrically in the X direction so as to hold therebetween the reticle R, and each motor drives the reticle stage RST in the Y direction relative to the frame member 18. Also, the third and fourth Y-axis linear motors 76B, 78B are disposed to face the first and second Y-axis linear motors 76A and 78A, and drive the reticle stage RST in the Y direction relative to the frame member 18.

In this present embodiment, the frame member 18 with the first drive mechanisms 36, 38 fixed on the inside in FIG. 2 is supported without contact via gas bearings between the reticle base 16 on the lower surface side and the illumination system side plate 14 on the upper surface side. For this reason, when the reticle stage RST is driven in the Y direction by the Y-axis linear motors 76A, 78A, 76B, 78B, the frame member 18 moves slightly in the opposite direction so as to cancel the reaction force. As a result, the occurrence of vibrations when driving the reticle stage RST is inhibited. However, the movement of the frame member 18 is slight because the mass of the frame member 18 relative to the mass of the reticle stage RST is very large. According to the present embodiment, when the reticle stage RST (reticle R) is to be driven at the same speed in the Y direction, the first and third Y-axis linear motors 76A and 76B and the second and fourth Y-axis linear motors 78A and 78B are also operated synchronously, and they drive the reticle stage RST with almost equal thrust in the Y direction relative to the frame member 18. Also, when the angle of rotation θz (yawing) of the reticle stage RST has to be corrected, the ratio of the magnitude of the thrust generated by the first and the third Y-axis linear motors 76A and 76B, and the thrust generated by the second and the fourth Y-axis linear motors 78A and 78B is controlled.

As shown in FIG. 3, the second drive mechanism 40 is provided with stator units 140A, 140B as a pair of stators oriented lengthwise in the Y direction, and a pair of fixing members 156 that retain these stator units 140A, 140B at one end and the other end of the Y direction (oriented lengthwise). In this case, the stator units 140A, 140B are disposed at a specific spacing in the Z direction (vertical direction) to face each other and are held parallel to each other in the XY plane by a pair of fixing members 156. Each of the pair of fixing members 156 is fixed to the inner wall face of the frame member 18.

The stator units 140A, 140B have a rectangular cross section (oriented lengthwise) frame made of non-magnetic material, as shown in FIG. 5, wherein a coil is disposed. Returning to FIG. 5, a permanent magnet 30 of rectangular cross section (oriented lengthwise) in plate form is disposed as a mover fixed at the end of the reticle stage RST in the +X direction to generate a magnetic field in the Z direction, via a specific clearance between each of the stator units 140A, 140B. Instead of the permanent magnet 30, a magnet unit made of a magnetic body member and a pair of flat permanent magnets each fixed to the upper and lower face thereof may be used.

In this case, the permanent magnet 30 and the stator units 140A, 140B are disposed almost symmetrically about the neutral surface CT taken as reference (see FIG. 4B and FIG. 5). Consequently, electromagnetic force (Lorentz force) is generated in the X direction in the coil because of the electromagnetic interaction between the magnetic field in the Z direction formed by the permanent magnet 30 and the electric current flowing in the Y direction through the coils that form the stator units 140A, 140B, and the reaction force of this electromagnetic force becomes the thrust that drives the permanent magnet 30 (reticle stage RST) in the X direction. In this case also, the frame member 18 moves slightly in a direction opposite to that of the reticle stage RST so as to cancel out the reaction when driving the reticle stage in the X direction. Accordingly, the occurrence of vibrations when driving the reticle stage RST in the X direction is inhibited.

As described above, the stator units 140A, 140B and the permanent magnet 30 are used to form an X-axis voice coil motor 79, which is a moving magnet type motor that can finely drive the reticle stage RST in the X direction. The second drive mechanism 40 is constituted by the X-axis voice coil motor 79 as the drive apparatus.

The result is that the reticle stage RST of the present embodiment of FIG. 2 is a guideless stage supported such that it can relatively displace with respect to the frame member 18 with three degrees of freedom in the X direction, Y direction and the θz direction. Since the reticle stage RST is driven relatively with respect to the frame member 18, a 5-axis drive device is installed, which includes Y-axis linear motors 76A, 78A, 76B, 78B of the four axes that generate thrust in the Y direction and an X-axis voice coil motor 79 of one axis that generates thrust in the X direction.

According to the present embodiment, moving pieces 60A, 60B, 60C that include a magnet unit that forms the magnetic field in the Z direction, as shown in FIG. 3, are also installed on the side face in the +X direction and the side face in the +Y direction of the frame member 18. Stators 62A, 62B that include coils through which current flows in the Y direction and stator 62C that includes a coil through which current flows in the X direction are provided in the reticle base 16 via support stands 64A, 64B, 64C corresponding to the moving pieces 60A, 60B, 60C. Accordingly, the drive force (reaction of the Lorentz force) in the X direction acts on the moving pieces 60A, 60B by supplying current in the Y direction to the coil in the stators 62A, 62B. That is, trim motors for drive in the X direction are each formed from moving magnet type voice coil motor, by mover 60A and stator 62A, and mover 60B and stator 62B, respectively. Also, the drive force (reaction of the Lorentz force) in the X direction acts on the stators 60C by supplying current in the Y direction to the coil in the stator 62C. Also, the trim motor for drive in the Y direction is formed from moving magnet type voice coil motor, by mover 60C and stator 62C. By using these three trim motors, the frame member 18 can be driven with three degrees of freedom in the X direction, the Y direction, and the θz direction with respect to the reticle base 16.

As mentioned above, when driving the reticle stage RST in the X direction, the Y direction, and the θz direction, the frame member 18 moves slightly so as to cancel out its action. Therefore, the position of the frame member 18 in the XY plane may gradually shift. By using trim motors formed by the moving pieces 60A to 60C and the stators 62A to 62C, the position of the frame member 18 can be returned to the center periodically, for example, and the offset of the position of the frame member 18 with respect to the reticle base 16 can be prevented.

Next, example constitutions of the laser interferometer that includes the first and second optical systems 31, 32 of FIG. 4A of the present embodiment shall be described in detail.

FIG. 6 is a plan view of the main portions showing the state of the reticle stage RST of FIG. 4A placed on the reticle base 16 of FIG. 1. In FIG. 6, optical systems 31 and 32 are respectively fixed on the optical member support portion 24B1 and 24B2 separated in the Y direction at the end portion in the −X direction of the reticle stage RST (reticle stage body 22). The first optical system 31 is a pentaprism provided with a half mirror surface 31a, a polarization beam splitter surface 31b, an incidence/exit surface 31c provided with a ¼ wavelength plate, and a full reflecting surface 31d. The second optical system 32 is a pentaprism provided with a full reflecting surface 32a, a polarization beam splitter surface 32b, an incidence/exit surface 32c provided with a ¼ wavelength plate, and a full reflecting surface 32d. The laser light source 69XL and first receiver 69XA are disposed in the +Y direction with respect the first optical system 31 across the window glass g1. The second receiver 69XB is disposed in the −Y direction with respect the second optical system 32 across the window glass g2. The fixed mirror MX is disposed parallel to the Y axis on the reticle base 16 so as to face the optical systems 31 and 32 in the −X direction.

In this constitution, the laser beam LX that is radiated parallel to the Y axis from the laser light source 69XL (consisting of two components that have a predetermined frequency difference and whose polarization directions are mutually perpendicular as described above) is divided by the half mirror surface 31a of the first optical system 31 into a first laser beam that is reflected light and a second laser beam that is transmitted light. The first laser beam heads to the polarization beam splitter face 31b, and the second laser beam heads to the second optical system 32. The S polarization component of the first laser beam is reflected to the side of the first receiver 69XA as a first reference beam LX2 by the polarization beam splitter face 31b. Also, the P polarization component of the first laser beam, after being transmitted through the polarization beam splitter face 31b as a first measuring beam LX1, passes through the incidence/exit face 31c (¼ wavelength plate) to be incident on the reflecting surface of the fixed mirror MX in a manner parallel with the X axis. The first measuring beam LX1 that is reflected there passes through the incidence/exit face 31c, the polarization beam splitter face 31b, the full reflecting surface 31d and the incidence/exit face 31c to be again incident on the reflecting surface of the fixed mirror MX in a manner parallel with the X axis. The first measuring beam LX1 that is again reflected there, upon passing through the incidence/exit face 31c and the full reflecting surface 31d, becomes P polarization light, and after being transmitted through the polarization beam splitter surface 31b, is coaxially combined with the first reference beam LX2 to be incident on the receiver 69XA. At this time, by installing a ¼ wavelength plate at the exit surface of the first optical system 31 or the incidence surface and the like of the receiver 69XA, it is possible to detect the interference light (beat light) between the first measuring beam LX1 and the first reference beam LX2 at the receiver 69XA. Accordingly, it is possible to measure the position (displacement) in the X direction of the first optical system 31 (the polarization beam splitter face 31b) with respect to the fixed mirror MX at a resolution of approximately 0.1 nm by the aforementioned double pass interference method from the photoelectric conversion signal.

On the other hand, the abovementioned second laser beam is reflected in the −X direction by the full reflecting surface 32a of the second optical system 32. The S polarization component of the second laser beam is reflected to the side of the second receiver 69XB as a second reference beam LX4 by the polarization beam splitter surface 32b. Also, the P polarization component of the second laser beam, after being transmitted through the polarization beam splitter surface 32b as a second measuring beam LX2, passes through the incidence/exit face 32c (¼ wavelength plate) to be incident on the reflecting surface of the fixed mirror MX in a manner parallel with the X axis. The second measuring beam LX3 that is reflected there passes through the incidence/exit face 32c, the polarization beam splitter face 32b, the full reflecting surface 32d and the incidence/exit face 32c to be again incident on the reflecting surface of the fixed mirror MX in a manner parallel with the X axis. The second measuring beam LX3 that is again reflected there, upon passing through the incidence/exit face 32c and the full reflecting surface 32d, becomes P polarization light, and after being transmitted through the polarization beam splitter surface 32b, is coaxially combined with the second reference beam LX4 to be incident on the receiver 69XB. At this time, by installing a ¼ wavelength plate at the exit surface of the second optical system 32 or the incidence surface and the like of the receiver 69XB, it is possible to detect the interference light (beat light) between the second measuring beam LX3 and the second reference beam LX4 at the receiver 69XB. Accordingly, it is possible to measure the position (displacement) in the X direction of the second optical system 32 (the polarization beam splitter face 32b) with respect to the fixed mirror MX at a resolution of approximately 0.1 nm by the aforementioned double pass interference method from the photoelectric conversion signal. Accordingly, it is possible to measure at a high precision the position (displacement) in the X direction with respect to the reticle base 16 with two locations separated in the Y direction of the reticle stage RST (reticle stage body 22) using the laser interference method.

Returning to FIG. 1, a reducing system with a projection factor of say ¼ or ⅕, telecentric on both sides and formed by catadioptric system is used as the projection optical system PL. The reduced image via the projection optical system PL of the pattern in the illumination area IAR of the reticle R is transferred onto the slender exposure area IA on one of the shot regions on the wafer W (substrate) disposed on the object face of the projection optical system PL and resist coated.

The projection optical system PL is held by supporting members (not shown in the figures) via the flange FLG installed in the lens barrel. In the lens barrel of the projection optical system PL, a purge gas that allows the exposure light IL to pass through is supplied by the flow method via a gas supply mechanism not illustrated. Also, the projection optical system PL is a catadioptric system, and a concave mirror 50 (mirror) that reflects the exposure light IL from the optical axis AX side to the optical axis AX side is retained via a lens frame 51 within a portion that protrudes in the +Y direction of the mirror. The concave mirror 50 can have a high density portion 50a that includes a reflecting surface 50c and a low density portion 50b. The density of the low density portion 50b can be set to approximately ½, ⅓, ¼, ⅕, ⅙, 1/7, ⅛, 1/9, 1/10, or 1/20 or less than that of the high density portion 50a. In one embodiment, the concave mirror 50 is made from a porous ceramic, and the density of the high density portion 50a (portion in which a higher degree of flatness is locally required than other portions) that includes the reflecting surface 50c is approximately 3 to 4 g/cm$^3$ and the density of the low density portion 50b other than that is 1/10 of that. Accordingly, it is possible to reduce the weight of the concave mirror 50 and impart a high degree of flatness to the reflecting surface 50c.

In the present embodiment, a plurality of mirrors such as plane mirrors for bending the optical path are provided in the illuminating optical system unit IOP of the projection exposure apparatus 10 of FIG. 1. Thereby, the mirrors can be formed from a material with a non-uniform density distribution, such that the density of the portion that includes the reflecting surface is high, and the density of the other portions is low. Thereby, it is possible to maintain the degree of flatness of the reflecting surface at a high level and reduce the overall weight of the exposure apparatus.

The wafer stage WST is disposed in the wafer chamber 80. The wafer chamber 80 is covered by a wall 71 wherein a circular opening 71a is formed through which the lower end of the projection optical system PL passes at substantially the center of the ceiling. This wall 71 is formed from a low-degassing material such as stainless steel (SUS). The area between the perimeter of the opening 71a in the ceiling wall of the wall 71 and the flange FLG of the projection optical system PL is sealed without gaps by a flexible bellows 97. By doing so, the inner portion of the wafer chamber 80 is isolated from the outside.

A wafer base BS (guide portion) made of a table is supported substantially horizontally via multiple vibration preventing units 86 in the wafer chamber 80. The wafer stage WST (moving portion) has a wafer holder 25 that holds the wafer W by vacuum chucking and the like, and is placed on the wafer base BS via a static pressure gas bearing. The wafer stage WST is driven in the two-dimensional direction (XY) along the upper face of the wafer base BS by the wafer drive system (not shown in the figures) including a linear motor, for example. As shown in FIG. 1, one end of a supply pipe 41 and one end of an exhaust pipe 43 are connected to the wall 71 of the wafer chamber 80. The other end of the supply pipe 41 is connected to the purge gas supply apparatus not illustrated, and the other end of the exhaust pipe 43 is connected to a gas recovery apparatus outside. Then, similarly as described above, the purge gas is always supplied to the inside of the wafer chamber 80 by the flow method.

A light transmitting window 85 is provided in the side wall on the −Y direction side of the wall 71 of the wafer chamber 80. Similarly, a light transmitting window, although not shown in the figures, is provided on the side wall in the +X direction side of the wall 71. Also, a reflecting surface 56Y made of a plane mirror as a Y-axis moving mirror is formed at the end portion of the wafer holder 25 on the −Y direction side. Similarly, a reflecting surface 56X (refer to FIG. 8) made of a plane mirror as an X-axis moving mirror, although not shown in the figures, is formed at the end portion on the +X direction side of the wafer holder 25. The length measuring beams LWY etc. from the Y-axis laser interferometer 57Y and the X-axis laser interferometer (not shown in the figures) outside the wafer chamber 80 are directed on the Y-axis moving mirror 56Y and the X-axis moving mirror (not shown in the figures) via the light transmitting window 85 and the transmitting window (not shown in the figures). The Y-axis laser interferometer 57Y and the X-axis laser interferometer measure the position of the moving mirror and the angle of rotation each corresponding to, for example, the internal reference mirror as the reference; that is, they measure the position of the wafer W in the X direction and the Y direction, and the angle of rotation about the X axis, the Y axis and the Z axis. The measurement values of the Y-axis laser interferometer 57Y and the X-axis laser interferometer are fed to the stage control system 90 and the main control device 70. The stage control system 90 controls the position and speed of the wafer stage WST via the drive system (not shown in the figures), based on the measurement values and the control data from the main control device 70.

In FIG. 1, the wafer holder 25 that is mounted to the wafer stage WST is formed from a porous ceramic material with a non-uniform density distribution. The wafer holder 25 can have a high density portion 25a and a low density portion 25b. The density of the low density portion 25b can be set to approximately ½, ⅓, ¼, ⅕, ⅙, ⅐, ⅛, ⅑, ⅒, or 1/20 or less than that of the high density portion 25a. In one embodiment, the high density portion 25a (portion in which a higher degree of flatness is locally required than other portions) that includes the reflecting surfaces 56Y and 56X (refer to FIG. 8) of the wafer holder 25 is approximately 3 to 4 g/cm$^3$ and the density of the low density portion 25b other than that is 1/10 of that. In practice, it is desirable to increase the density in order to increase the rigidity and strength of the portion where the wafer W is placed on the wafer holder 25.

Figure 8:
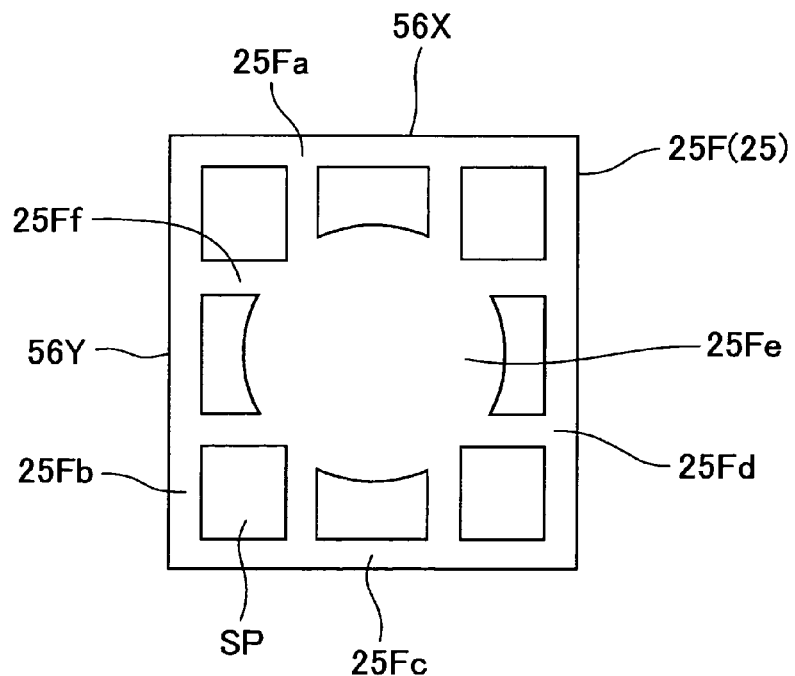
FIG. 8 is an explanatory drawing of the manufacturing process of the wafer holder of FIG. 1.

In the case of manufacturing the wafer holder 25, as shown in FIG. 8, frame portions 25Fa and 25Fb where the reflecting surfaces 56X and 56Y are formed, frame portions 25Fc and 25Fd that respectively face thereto, a substantially circular flat plate portion 25Fe where the wafer W is placed, and a frame portion 25F consisting of multiple ribs 25Ff that connect the frame portions are formed from a high-density porous ceramic. Then, a low density porous ceramic is filled in spaces SP between the ribs 25Ff of the frame portion 25F, and the top and bottom thereof are covered with thin plates made of high-density porous ceramic, with the totality being bake-hardened. Thereby, upon obtaining the required rigidity, strength, and degree of flatness, it is possible to reduce the overall weight of the wafer 25.

Also, in FIG. 1, the bottom surface of the wafer stage WST and the top surface of the wafer base BS are disposed facing each other with the compressed gas of a gas bearing therebetween. Therefore, it is possible to form the frame of the wafer stage WST and the wafer base BS with materials of a non-uniform density distribution (for example, sintered metal). For example, it is possible to have the portion that includes the bottom surface of the wafer stage WST be a high density portion WSTa and portions other than that be a low density portion WSTb, and have the portion that includes the top surface of the wafer base BS be a high density portion BSa and portions other than that be a low density portion BSb. Thereby, by reducing the overall weight of the wafer stage WST and the wafer base BS, it is possible to obtain a high degree of flatness at the portion that constitutes the gas bearing. Note that the present invention can be applied to, for example, a wafer stage without being limited to the present embodiment.

Next, the flow of basic exposure operation by the projection exposure apparatus 10 shown in FIG. 1, configured as mentioned above, is described here in a simple manner.

First, reticle loading and wafer loading are performed under the control of the main control device 70, by the reticle loader and the wafer loader (not shown in the figures). Next, reticle alignment and wafer alignment are performed using the reticle alignment system, a reference mark plate on the wafer stage WST, an off-axis alignment detection system (all not shown in the figures) and the like. Then, the wafer stage WST is first moved such that the position of the wafer W comes at the scanning start position for exposure of the first shot region (first shot) on the wafer W. At the same time, the reticle stage RST is moved such that the position of the reticle R comes at the scanning start position. With the instructions from the main control device 70, and based on the position data of the reticle R measured by the reticle interferometers 69Y, 69YR and the like on the reticle side and the position data of wafer W measured by the Y-axis laser interferometer 57Y and the X-axis laser interferometer on the wafer side, the stage control system 90 synchronously moves the reticle R (reticle stage RST) and the wafer W (wafer stage WST) in the Y direction (scanning direction) and irradiates the exposure light IL, thereby performing scanning exposure of the first shot. Next, after the wafer stage WST moves by a step equivalent to the one-shot region only in the Y direction or the non-scanning direction (X direction), scanning exposure of the next shot region is performed. In this way, step movement between shots and scanning exposure are sequentially repeated, and the pattern of reticle R is transferred to each shot region on the wafer W.

According to the present embodiment, since the weight of the reticle stage RST and the wafer stage WST can be reduced, during scanning exposure it is possible to move the reticle stage RST and the wafer stage WST at a higher speed, and thus the throughput of the exposure process increases. Also, the weight of the concave mirror 50 is reduced, and the weight of the projection exposure apparatus as a whole is reduced, and so transport, placement and assembly of the projection exposure apparatus is simplified.

In the case of manufacturing a semiconductor device using the exposure apparatus of the aforementioned embodiment, semiconductor devices are produced by such steps such as step of designing the functions and performance of the device, a step of producing a reticle based on this step; a step of producing a wafer from a silicon material, a step of exposing a reticle pattern on to the wafer using the exposure apparatus as described in the embodiment above, a step of assembling the device (including dicing, bonding, and packaging steps), and an inspection step.

Note that the present invention is not limited to an exposure apparatus of the scanning exposure type, and can also be applied similarly to a stage system of a one-shot exposure-type exposure apparatus and a stage system of a semiconductor inspection apparatus. The magnification of the projection optical system in these cases may be the same, may be reduced or enlarged. Moreover, the present invention can also be applied to a stage system of a proximity exposure apparatus that does not employ a projection optical system.

Also, the present invention may also be used in a liquid immersion type exposure apparatus that is disclosed in PCT International Publication No. WO 1999/49504. That is, a liquid immersion region may be formed on a substrate so as to cover the exposure region, and exposure light may be irradiated on the substrate P via that liquid. Note that, water (pure water) may be used as the liquid, and in addition to water, perfluoropolyether (PFPE), a fluorinated fluid such as fluorinated oil or the like, or cedar oil may be used. Also, as the liquid, a liquid with a refractive index that is higher than that of water with respect to the exposure light (for example, a liquid with a refractive index of approximately 1.6 to 1.8) may be used. Moreover, it is possible to form the optical element that constitutes the first optical system PL and the second optical system HL with a material having a higher refractive index than quartz or fluorite (for example, 1.6 or more). Here, a liquid LQ with refractive index that is higher than pure water (for example. 1.5 or higher) includes for example a predetermined liquid with a C—H bond and an O—H bond such as isopropanol with a refractive index of approximately 1.5 and glycerol (glycerine) with a refractive index of approximately 1.61; a predetermined liquid (organic solvent) such as hexane, heptane, and decane; and Decalin (Decahydronaphthalene) with a refractive index of approximately 1.60. Alternatively, the liquid LQ may be one that is a mixture of any two or more of these liquids, and may be one that is made by adding (mixing) at least one of these liquids to/with pure water. Alternatively, the liquid LQ may be one in which an acid or a base such as $H^+$, $Cs^+$, and $K^+$, or $Cl^-$, $SO_4^{2-}$, and $PO_4^{2-}$ is added to (mixed with) pure water, and one in which fine particles of for example Al oxide are added to (mixed with) pure water may be used. The liquid is preferably one with a low light absorption coefficient, a low temperature dependency, and which is stable with respect to a photosensitive material (or top coat film or anti-reflection film, etc.) coated on the surface of the projection optical system and/or the substrate. It is also possible to use a supercritical solution as the liquid. Also, a top coat film and the like that protects the photosensitive material and substrate from the liquid may be provided on the substrate. Furthermore, an optical element in contact with the liquid may be formed from quartz (silica) or a single crystal material of a fluoride compound such as calcium fluoride (fluorite), barium fluoride, strontium fluoride, lithium fluoride, and sodium fluoride, and may be formed from a material with a refractive index that is higher than that of quartz or fluorite (for example 1.6 or more). As materials with a refractive index that is 1.6 or more, it is possible to use sapphire and germanium dioxide, etc., disclosed in PCT International Patent Publication No. WO 2005/059617, and potassium chloride (refractive index of approximately 1.75) disclosed in PCT International Patent Publication No. WO 2005/059618.

In the case of using an immersion method, it is acceptable to fill the optical path on the object surface side of the terminal optical element in addition to the optical path of the image plane side of the terminal optical element with a liquid, as disclosed in PCT International Patent Publication No. WO 2004/019128 (corresponding U.S. Patent Application Publication No. 2005/0248856). Moreover, a thin film that has lyophilicity and/or a dissolution prevention mechanism may be formed on a portion of the surface of the terminal optical element (including at least the contact surface with the liquid) or all thereof. Note that silica has a high affinity with liquid, and a dissolution prevention mechanism is not required, but it is preferable to at least form a dissolution prevention film in the case of fluorite.

The above embodiment is one which measures the position information of the mask stage and the substrate stage using an interferometer system as the measurement system. However, the invention is not limited to this, and for example an encoder system that detects a scale (grating) provided for example on the top surface of the substrate stage may be used. In this case, as a hybrid system which uses both the interferometer system and the encoder system, preferably the measurement results of the interferometer system are used to perform calibration on the measurement results of the encoder system. Furthermore, the interferometer system and the encoder system may be alternately used, or both may be used, to perform position control of the substrate stage.

As the substrate P in the abovementioned embodiment, not only a semiconductor wafer for manufacturing a semiconductor device, but also a glass substrate for a display device, a ceramic wafer for a thin film magnetic head, or a mask or an original plate of a reticle (synthetic quartz or silicon wafer) used in an exposure apparatus, or a film member etc. can be used. Furthermore, the shape of the substrate is not limited to a circle, and may be another shape such as a rectangle.

Also, the exposure apparatus of the aforementioned embodiment may be provided with a measurement stage that is capable of moving independently of the substrate stage that holds the substrate, and on which is mounted a measurement member (for example, a reference member formed with a reference mark, and/or various types of photoelectronic sensors), as disclosed for example in Japanese Unexamined Patent Application Publication No. H11-135400 (corresponding PCT International Publication No. WO 1999-23692), and Japanese Unexamined Patent Application Publication No. 2000-164504 (corresponding U.S. Pat. No. 6,897,963).

In the abovementioned embodiment, a mask for forming a pattern was used, but it is possible to use instead an electronic mask that generates a variable pattern (also called a variable forming mask, an active mask, or a pattern generator). As an electronic mask, it is possible to use a deformable micro-mirror device or digital micro-mirror device (DMD) that is one type of non-light emitting type image display element (also called a spatial light modulator (SLM)). A DMD has a plurality of reflecting elements (micro-mirrors) that are driven based on predetermined electronic data. This plurality of reflecting elements are arrayed in a two-dimensional matrix on the surface of the DMD and are driven individually to reflect and deflect the exposure light. The angle of each reflecting element with reflect to the reflecting surface is adjusted. The operation of the DMD can be controlled by the control unit. The control unit drives the reflecting elements of the DMD based on the electronic data (pattern information) according to the pattern to be formed on the substrate and thus patterns with the reflecting elements the exposure light that is irradiated by the illumination system. By using the DMD, compared to the case of exposing by using a mask (reticle) on which is formed a pattern, mask changing work and an operation to align the position of the mask in the mask stage are unnecessary when changing the pattern. In an exposure apparatus that employs an electronic mask, the substrate may simply move in the X-axis and Y-axis directions by a substrate stage without providing a mask stage. An exposure apparatus that uses a DMD is disclosed for example in Japanese Unexamined Patent Application Publication No. H08-313842, Japanese Unexamined Patent Application Publication No. 2004-304135, and U.S. Pat. No. 6,778,257.

The present invention can also be applied to a multistage-type exposure apparatus provided with a plurality of substrate stages as disclosed for example in Japanese Unexamined Patent Application Publication No. H10-163099, Japanese Unexamined Patent Application Publication No. H10-214783 (corresponding U.S. Pat. No. 6,341,007, U.S. Pat. No. 6,400,441, U.S. Pat. No. 6,549,269, and U.S. Pat. No. 6,590,634), and Published Japanese Translation No. 2000-505958 of PCT International Publication (corresponding U.S. Pat. No. 5,969,441).

In the case of using a linear motor in the wafer stage system or reticle stage system, the moving stage may be retained by any method such as an air floating type using a gas bearing or a magnetic floating type. Then, the moving stage may be a type that moves along a guide, or a guideless type in which guides are not provided. Moreover, the reaction force that occurs during acceleration/deceleration during step movement of the wafer stage or reticle stage and scanning exposure may mechanically escape to the ground (earth) using a frame portion as disclosed in U.S. Pat. No. 5,528,118 or U.S. Pat. No. 6,020,710 (Japanese Unexamined Patent Application No. H08 330224).

Note that as uses of the exposure apparatus of the afore-described embodiment, without being limited to only an exposure apparatus for the production of semiconductor device, the present invention may be widely applied to exposure apparatuses for display devices such as liquid crystal display devices or plasma display formed on a square glass plate, and to exposure apparatuses for producing various devices such as image pickup elements (CCD etc.), micromachines, thin film magnetic heads, MEMS (Microelectromechanical Systems), or DNA chips. Moreover, the present invention can also be applied to an exposure process (exposure apparatus) when manufacturing a reticle on which reticle patterns of various devices are formed (photomask, etc.) using a photolithography process.

The present invention is not limited to the aforementioned embodiments, and modifications can be made without departing from the spirit or scope of the present invention. As far as is permitted by law, the disclosures in all of the Japanese Patent Publications and U.S. patents related to exposure apparatuses and the like cited in the above respective embodiments and modified examples, are incorporated herein by reference.

According to the present invention, it is possible to attain a further reduction in weight of a stage apparatus or exposure apparatus while scarcely lowering characteristics such as rigidity, strength and degree of flatness. Accordingly, in the case of being applied to an exposure apparatus, it is possible to perform mass production at a high throughput of each type of device with a high accuracy.

The invention claimed is:

1. A stage apparatus comprising:
   a moving portion on which an object is placed, the moving portion including a holder which moves while holding the object; and
   a guide portion that guides the moving portion in a non-contact floating manner;
   wherein the holder has a plurality of frame portions, the plurality of frame portions facing each other and forming spaces between them, and
   a density of the plurality of frame portions of the holder is higher than a density of other portions of the holder, which are located in the spaces formed between the frame portions.

2. The stage apparatus according to claim 1, wherein the guide portion has a first portion and a second portion that has a higher density than the first portion.

3. The stage apparatus according to claim 1, wherein the plurality of frame portions have a higher strength than the other portions.

4. The stage apparatus according to claim 3, wherein a screw bush or helisert is provided in the plurality of frame portions.

5. The stage apparatus according to claim 1, wherein the plurality of frame portions have a higher degree of flatness than the portions.

6. The stage apparatus according to claim 5, wherein the plurality of frame portions have a reflecting surface that reflects measuring light for position measurement.

7. The stage apparatus according to claim 5, wherein the plurality of frame portions have at least one part of portions that are oppositely disposed each other with a gas therebetween so as to form a gas bearing.

8. The stage apparatus according to claim 1, wherein the guide portion is formed form a porous ceramic or sintered metal.

9. The stage apparatus according to claim 1, wherein the density of the other portions of the holder with the lowest density is approximately $1/2$, $1/3$, $1/4$, $1/5$, $1/6$, $1/7$, $1/8$, $1/9$, $1/10$, or $1/20$ or less of the density of the plurality of frame portions with the highest density.

10. The stage apparatus according to claim 1, wherein the holder is formed by bake hardening after filling a low-density material in the spaces formed between the frame portions of high density.

11. The stage apparatus according to claim 1, wherein the guide portion is formed from a material having a non-uniform density distribution, with a density of the material continuously changing.

12. An exposure apparatus that exposes a substrate with a pattern that is illuminated by exposure light, comprising a stage apparatus according to claim 1 that drives a mask on which the pattern is formed or the substrate.

13. The stage apparatus according to claim 1, wherein
   the object includes a wafer, the moving portion includes a wafer stage which moves while holding the wafer, the object being held by the holder that is disposed on the wafer stage, and
   the guide portion includes a wafer base.

14. The stage apparatus according to claim 1, wherein
   the object includes a reticle, the moving portion includes a reticle stage which moves while holding the reticle, the object being held by the holder that is disposed on the reticle stage, and
   the guide portion includes a reticle base.

15. The stage apparatus according to claim 1, wherein
   the moving portion includes a wafer stage which moves while holding the object, the object being held by the holder that is disposed on the wafer stage, and
   a density of a portion of the wafer stage which includes a bottom surface of the wafer stage is higher than a density of another portion of the wafer stage, the bottom surface of the wafer stage facing an upper surface of the guide portion.

16. The stage apparatus according to claim 15, wherein a density of a portion of the guide portion which includes the upper surface of the guide portion is higher than a density of another portion of the guide portion.

17. An exposure apparatus comprising:
   an illuminating optical system which contains, on the optical path for the exposure light inside the illuminating optical system, a purge gas consisting of nitrogen or an inert gas, which irradiates a pattern by exposure light;
   a projection optical system which contains, on the optical path for the exposure light inside the illuminating optical system, a purge gas consisting of nitrogen or an inert gas, in which a substrate is exposed with an image of the pattern via the illuminating optical system; and
   a mirror that is provided in the illuminating optical system or the projection optical system, with a reflecting surface,
   wherein the reflecting surface is a substantially flat surface and has a plurality of first portions, and
   a density of the plurality of first portions of the reflecting surface is higher than a density of another portion of the reflecting surface.

* * * * *